Sept. 10, 1968 T. G. ELLESTAD 3,401,351

DIFFERENTIAL AMPLIFIER

Filed Dec. 18, 1964

INVENTOR.
THOMAS G ELLESTAD
BY
Samuel E. Turner
ATTORNEY

United States Patent Office 3,401,351
Patented Sept. 10, 1968

3,401,351
DIFFERENTIAL AMPLIFIER
Thomas G. Ellestad, Santa Clara, Calif., assignor to General Electric Company, a corporation of New York
Filed Dec. 18, 1964, Ser. No. 419,394
10 Claims. (Cl. 330—69)

ABSTRACT OF THE DISCLOSURE

In order to provide a differential amplifier with improved common mode rejection without the use of additional active devices, low frequency and high frequency compensating means are implemented to cancel the effects of common mode signals without affecting the differential signal response. Low frequency common mode rejection is improved by providing compensating resistors between the input and the output terminals of each of the active elements of the differential amplifier pair whereby common mode current flowing through the output terminals of each of the active elements is opposed by an equal and opposite compensating current to deliver net common mode signals to zero to external loads. The effects of stray capacitance, which normally cause a decline in common mode rejection ratio as frequency increases, are minimized by providing a small compensating capacitor across a resistor common to the current paths of the active elements. Inasmuch as parasitic capacitances permit direct coupling of high frequency common mode signals from the input terminals to the output terminals of the active devices, the added small capacitor provides compensation by reducing the normal degenerative effect of the common resistor such that compensating currents flow through the output terminals of the active devices in opposition to the common mode signals directly coupled through the parasitic capacitances.

Figure 1:
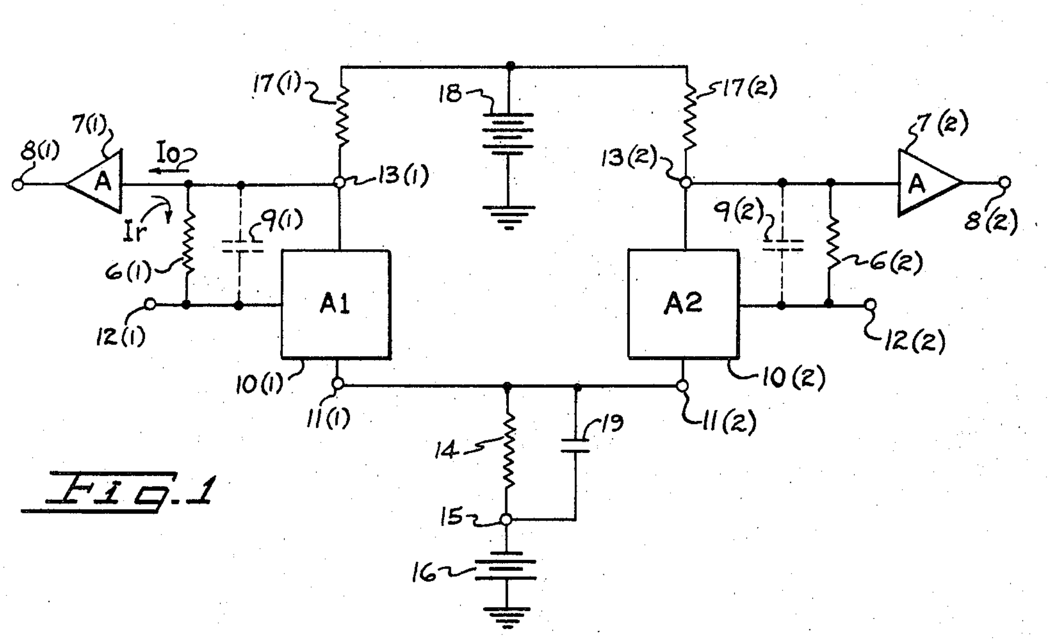

This invention relates to differential amplifiers and particularly to a differential amplifier circuit for increasing the common-mode rejection.

Differential amplifiers are well-known and the characteristics and design of such amplifiers have been discussed, for example, by R. D. Middlebrook in a book entitled, Differential Amplifiers, published by John Wiley & Sons, Inc., New York, 1963.

In its usual basic form a differential amplifier comprises a pair of amplifying devices, for example transistors or vacuum tubes, which draw their currents through a common (emitter or cathode) resistor and through individual output (collector or plate) impedances. Balanced or floating output signals may be taken from between the collectors (or plates) or a single-ended output signal may be taken from the collector (or plate) of one of the amplifying devices. In either case, the output signal is proportional to the difference between the input signals applied to the control elements of the amplifying devices.

Differential amplifiers have found many uses and they are particularly useful in the amplification of low-level signals in the presence of interference signals. An example of such use is in the amplification of signals from a magnetic transducer. The winding of the transducer may be provided with a grounded center-tap, the signals from the ends of the winding being applied to the control elements of the differential amplifier through a balanced transmission line. The differential amplifier thus provides a high degree of discrimination against interference signals, such as stray 60-cycle potentials, which are induced in the input system and are applied to both input terminals of the differential amplifier simultaneously. Since such interference signals usually appear simultaneously at both input terminals (that is, in common mode), they are not amplified in the differential mode. Such interference signals are, however, amplified in the common mode. Therefore, the degree of discrimination against such signals is a function of the common-mode rejection of the circuit.

Prior attempts to increase the common-mode rejection include the use of a large value of common coupling resistor to increase the degeneration of the amplifier to the common-mode input signals. There is, however, a practical limitation to this approach because of the concomitant requirement of higher D-C supply voltages.

The common-mode rejection can also be increased at the expense of using active elements in the common coupling circuit. For example, in one version an active element is employed as a constant-current generator and in another version an active element is employed in a common-mode negative feedback circuit. (See, for example, FIGS. 15 and 16 of the previously mentioned Middlebrook publication.)

It is an object of the present invention to increase the common-mode rejection of a differential amplifier circuit without the use of higher supply voltages or additional active elements or the like.

It is another object of the invention to provide increased common-mode rejection without significant increase in the cost and complication of the differential amplifier circuit.

These and other objects are achieved according to the invention by providing a differential amplifier circuit wherein increased low-frequency common-mode rejection is achieved by providing a resistor between the input and output terminals of at least one of the amplifiers, the value of this resistor being selected in relation to the value of the common coupling resistor to provide currents at the output terminal which oppose and effectively cancel the low-frequency common-mode currents at this terminal.

Increased high-frequency common-mode rejection is achieved according to the invention by providing a capacitor in parallel with the common coupling resistor, the value of this capacitor being selected in relation to the value of the parasitic capacity between the input and output terminals of the amplifiers of the circuit to provide currents at the output terminals which oppose and effectively cancel the high-frequency common-mode currents at the output terminals.

Figure 2:
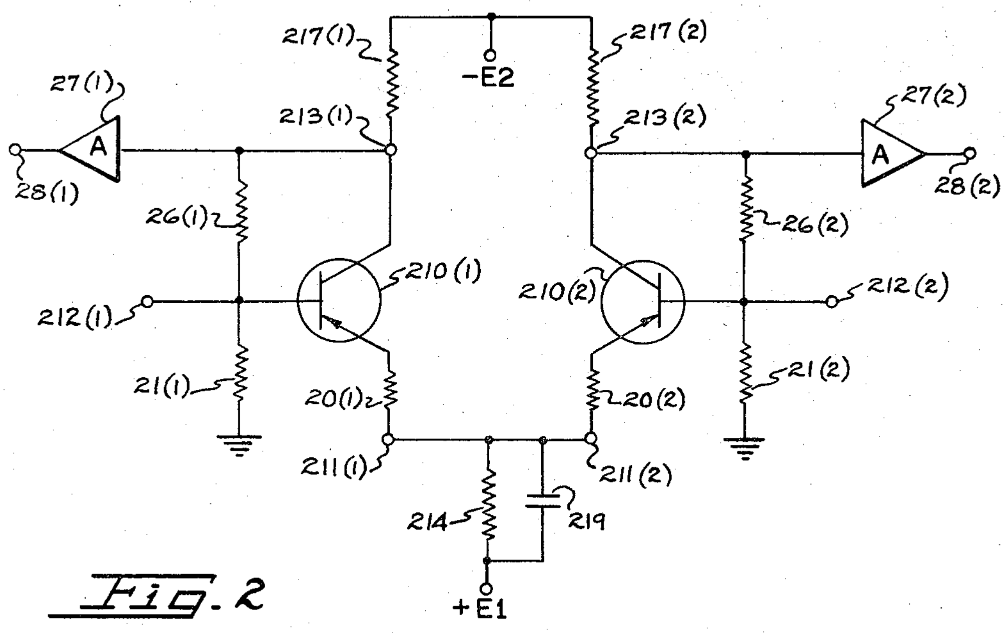

The invention is described more specifically hereinafter with reference to the accompanying drawing wherein:

FIGURE 1 is an illustration, partly in block diagram form, of a differential amplifier according to the invention; and FIGURE 2 is a schematic diagram of a transistor differential amplifier according to the invention.

The general form of a differential amplifier according to the invention is shown in FIG. 1. The basic circuit comprises a pair of similar amplifying devices (for example, transistors or vacuum tubes) 10(1) and 10(2) having respective power supply terminals 11(1) and 11(2), respective signal input or control terminals 12(1) and 12(2) and respective output terminals 13(1) and 13(2). The supply terminals 11(1) and 11(2) are connected to one end of a common coupling resistor 14, the other end of resistor 14 being connected through a reference terminal 15 to a source of reference potential illustrated as a battery 16.

The output terminals 13(1) and 13(2) are each connected by a respective one of a pair of output load resistors 17(1) and 17(2) to a source of D-C power, illustrated as a battery 18. Output loads for the differential amplifier are illustrated in FIG. 1 as a pair of similar amplifiers 7(1) and 7(2), these amplifiers preferably having low input impedances.

Operation of the basic circuit is briefly as follows: When a differential-mode input signal (that is, one that is floating or is double-ended with respect to ground) is applied between the input or control terminals 12(1) and 12(2), the voltage at one of the input terminals increases with respect to the voltage at reference terminal 15 and the voltage at the other input terminal decreases by a similar amount. Thus, assuming linear operation of the amplifying devices 10(1) and 10(2) the currents therethrough, and through the load resistors 17(1) and 17(2), correspondingly increase and decrease by similar amounts from the equal quiescent values. Thus, the voltages at the output terminals 13(1) and 13(2) change by similar amounts and in opposite directions to provide output signals proportional to the difference of the input signal voltages applied to control terminals 12(1) and 12(2). Floating output signals may be taken from between the output terminals 13(1) and 13(2) or single-ended output signals may be taken from between one of these output terminals and a reference point such as ground.

The current through the common coupling resistor 14, and hence the voltage drop across it, does not change in response to a differential-mode input signal because the increase in the current drawn by one of the amplifying devices is offset by the decrease in the current drawn by the other. Therefore the coupling resistor 14 provides no degeneration for a differential-mode input signal.

If, however, a common-mode signal is applied to the input or control terminals 12(1) and 12(2) (that is, a signal which is in-phase at both input terminals, typical of interference signals), the voltages at these terminals change in equal amounts in the same direction. Therefore, the total circuit current through the common coupling resistor 14 changes and a degenerative feedback voltage is developed across it in response to this common-mode input signal. This reduces the gain of the circuit for common-mode signals as compared to the gain of the circuit for differential-mode signals.

Thus the basic differential amplifier provides common-mode discrimination through the agency of the degenerative effect of the common coupling resistor to the common-mode input signals, the degree of discrimination being a function of the effective value of this common resistance.

Common-mode rejection, which may be defined as the degree to which a differential amplifier can prevent a common-mode input signal from producing an output signal, depends not only upon the discrimination through degenerative feedback, as discussed above, but also upon the degree of circuit unbalances. For example, a common-mode input signal will (in the absence of compensation) produce an output signal if the gains of the amplifying devices 10(1) and 10(2) are different.

As mentioned hereinbefore, prior methods for increasing the common-mode rejection include the use of a high value of common coupling resistor or the use of active devices to increase the common-mode negative feedback. According to the present invention the common-mode rejection is increased with only passive elements and without the expense and complication of additional active elements or higher supply voltages.

Thus according to the present invention the common-mode rejection is increased by providing compensating currents at the output terminals of the amplifying devices which oppose and are of a value to substantially cancel the effects of common-mode currents at these terminals.

Low-frequency common-mode compensation is provided by a pair of resistors 6(1) and 6(2), each connected between the input and output terminals of a respective one of the amplifying devices 10(1) and 10(2).

Assuming that the output amplifiers 7(1) and 7(2) present low input impedances, the operation of, for example, the resistor 6(1) to provide low-frequency common-mode compensation may be explained as follows. Assume that a negative-going low-frequency common-mode signal is applied to the input terminals 12(1) and 12(2). This negative voltage at terminal 12(1) causes a decrease in current flow through amplifying device 10(1) and results in a current $I_o$ from output terminal 13(1) toward output amplifier 7(1) and through the input impedance thereof. This negative voltage at terminal 12(1), also results in a current $I_r$ through compensating resistor 6(1), this current being in a direction to oppose the current $I_o$. If the value of the resistor 6(1) is appropriately selected, the currents $I_o$ and $I_r$ cancel and no output signal from amplifier 7(1) results. To provide balanced operation, the resistor 6(2) provides similar compensation in the right-hand side of the circuit.

It is found by analysis (not given) and experimentation that the values of compensating resistors 6(1) and 6(2) are related to the value of the common coupling resistor 14. To provide effective low-frequency compensation it is found that each of the resistors 6(1) and 6(2) has a value substantially equal to twice the value of resistor 14. Due to component variations it is preferable to experimentally adjust resistors 6(1) and 6(2) from this nominal value to provide the optimum low-frequency common-mode rejection under operating conditions.

For high-frequency input signals it is found that the common-mode rejection is a substantial function of the parasitic capacitance between the input and output terminals of the differential amplifier. In FIG. 1 this capacitance is represented by a pair of capacitors 9(1) and 9(2). (Where the amplifying devices 10(1) and 10(2) are transistors, for example, the capacitors 9(1) and 9(2) are predominantly the base to collector capacitances of the transistors.) In effect, these parasitic capacitors 9(1) and 9(2) provide a direct coupling of high-frequency input signals from the input terminals to the output terminals. The frequency above which this effect comes into play is found to be a frequency $f$ given by the following expression:

$$f=\frac{1}{4\pi RC}$$

where $R$=the value of resistor 14; and $C$=the value of the parasitic capacity, for example, the value of capacitor 9(1).

According to the present invention compensation is provided for this effect by a capacitor 19 connected in parallel with the common coupling resistor 14. This capacitor 19 reduces the degenerative effect of resistor 14 for high-frequency signals and results in signals at the output terminals 13(1) and 13(2) which are out-of-phase and therefore in opposition to the direct-coupled signals through capacitors 9(1) and 9(2). Thus substantial cancellation of these signals can be achieved by selecting an appropriate value of the compensating capacitor 19.

For effective high-frequency common-mode compensation, the value of capacitor 19 is found to be substantially twice the value of the parasitic capacity, for example, twice the value of capacitor 9(1). However, due to component tolerances, it is preferable to experimentally adjust capacitor 19 from this nominal value for optimum high-frequency common-mode rejection under operating conditions.

Shown in FIG. 2 is a schematic diagram of a specific embodiment of a differential amplifier according to the invention which utilizes a pair of transistors 210(1) and 210(2) as the amplifying devices. Output loads for the differential amplifier are provided by a pair of amplifiers 27(1) and 27(2), shown in block form, preferably having low input impedances. (It is noted that if only single-ended output signals are required, one of the output amplifiers 27(1) or 27(2) can be replaced with an equivalent impedance to maintain circuit balance.)

The circuit of FIG. 2 comprises a common coupling resistor 214 connected at one end to a source of reference potential E1 and at its other end to a pair of supply terminals 211(1) and 211(2); a pair of emitter bias resistors 20(1) and 20(2) connect the terminals 211(1) and 211(2) to respective emitters of transistors 210(1) and 210(2). The collectors of transistors 210(1) and 210(2) are respectively connected to a pair of output terminals 213(1) and 213(2) and a pair of collector load resistors 217(1) and 217(2) are connected between these terminals and a power source E2. Input signals are applied to the bases of the transistors through a pair of input terminals 212(1) and 212(2) and across a pair of input resistors 21(1) and 21(2).

Low-frequency common-mode compensation is provided by a pair of resistors 26(1) and 26(2) while high-frequency compensation is provided by a capacitor 219 in parallel with the common coupling resistor 214, the values of these compensating components being selected as previously described in connection with the description of FIG. 1.

Thus what has been described is a differential amplifier circuit providing improved common-mode rejection through the use of only passive elements and without the expense and complication of higher supply voltages or additional active elements.

While the principles of the invention have been made clear in the illustrative embodiments, there will be obvious to those skilled in the art, many modifications in structure, arrangement, proportions, the elements, materials and components used in the practice of the invention, and otherwise, which are adapted for specific environments and operating requirements, without departing from these principles. The appended claims are therefore intended to cover and embrace any such modifications within the limits only of the true spirit and scope of the invention.

What is claimed is:

1. A differential amplifier circuit comprising: a pair of amplifying devices each having at least three terminals including a power supply terminal, an output terminal and a control terminal for receiving input signals; a first resistor; means connecting one end of said resistor to a source of reference potential; means connecting the other end of said resistor to the power supply terminals of said devices; a pair of load impedances each connected at one end to the output terminal of a respective one of said devices and each connected at its other end to a source of potential different from said reference potential; means for increasing the low-frequency common-mode rejection of said circuit including a second resistor and means connecting said second resistor between the control terminal and the output terminal of one of said devices, said second resistor having a value to provide a current at said output terminal of said one of said devices in a direction opposite to and substantially equal to the low-frequency common-mode current at said output terminal of said one of said devices when a low-frequency input signal is applied to the control terminals of said devices; and means connected to the output terminal of said one of said devices for receiving output signals therefrom.

2. The differential amplifier circuit of claim 1 wherein said second resistor has a value substantially equal to twice the value of said first resistor.

3. A differential amplifier circuit comprising: a pair of amplifying devices each having at least three terminals including a power supply terminal, an output terminal and a control terminal for receiving input signals: a resistor; means connecting one end of said resistor to a source of reference potential; means connecting the other end of said resistor to the power supply terminals of said devices; a pair of load impedances each connected at one end to the output terminal of a respective one of said devices and each connected at its other end to a source of potential different from said reference potential; and means for increasing the high-frequency common-mode rejection of said circuit including a capacitor connected in parallel with said resistor, said capacitor having a value to provide signals at the output terminals of said devices in opposition to the high-frequency common-mode signals at said output terminals when a high-frequency signal is applied to the control terminals of said devices.

4. The differential amplifier circuit of claim 3 wherein said capacitor has a value substantially equal to twice the value of the parasitic capacity between the control terminal and the output terminal of one of said amplifying devices.

5. A differential amplifier circuit comprising: a pair of amplifying devices each having at least three terminals including a power supply terminal, an output terminal and a control terminal for receiving input signals; a common resistor; means connecting one end of said resistor to a source of reference potential; means connecting the other end of said resistor to the power supply terminals of said devices; a pair of load impedances each connected at one end to the output terminal of a respective one of said devices and each connected at its other end to a source of potential different from said reference potential; and means for increasing the low-frequency common-mode rejection of said circuit including a pair of compensating resistors each connected between the input terminal and output terminal of a respective one of said amplifying devices, each of said compensating resistors having a value to provide a current at its respective output terminal in a direction opposite to and substantially equal to the common-mode current at said respective output terminal when a low-frequency input signal is applied to the control terminals of said devices.

6. The differential amplifier circuit of claim 5 wherein said compensating resistors each have a value substantially equal to twice the value of said common resistor.

7. A differential amplifier circuit comprising: a pair of amplifying devices each having at least three terminals including a power supply terminal, an output terminal and a control terminal for receiving input signals; a common resistor; means connecting one end of said resistor to a source of reference potential; means connecting the other end of said resistor to the power supply terminals of said devices; a pair of load impedances each connected at one end to the output terminal of a respective one of said devices and each connected at its other end to a source of potential different from said reference potential; means for increasing the low-frequency common-mode rejection of said circuit including a pair of compensating resistors each connected between the input terminal and output terminal of a respective one of said amplifying devices, each of said compensating resistors having a value to provide a current at its respective output terminal in a direction opposite to and substantially equal to the common-mode current at said respective output terminal when a low-frequency input signal is applied to the control terminals of said devices; and means for increasing the high-frequency common-mode rejection of said circuit including a capacitor connected in parallel with said common resistor, said capacitor having a value to provide signals at the output terminals of said devices in opposition to the common-mode signals at said output terminals when a high-frequency signal is applied to the control terminals of said devices.

8. The differential amplifier circuit of claim 7 wherein said high-frequency signal has a frequency greater than the frequency at which reactance of the parasitic capacity between the input and output terminals of one of said devices is numerically equal to twice the value of said common resistor.

9. A differential amplifier circuit, comprising: a pair of transistors; a common resistor; means connecting one end of said common resistor to the emitters of said transistors; means connecting the other end of said common resistor to a reference potential source; a pair of collector resistors each connected at one end to the collector of a respective one of said transistors and each connected at its other end to a source of potential different from said reference potential; output signal receiving means for receiving output signals from at least one of said transistors, said receiving means being connected to the collector of said one of said transistors; a pair of input terminals for receiving input signals; means connecting each of said input terminals to the base of a respective one of said transistors; and means for increasing the low-frequency common-mode rejection of said circuit including a pair of compensating resistors each connected between the base and collector of a respective one of said transistors, each of said compensating resistors having a value substantially equal to twice the value of said common resistor.

10. The differential amplifier circuit defined by claim 9 further including means for increasing the high-frequency common-mode rejection of said circuit comprising a compensating capacitor connected in parallel with said common resistor, said capacitor having a value substantially equal to twice the value of the collector-to-base capacity of one of said transistors.

References Cited

UNITED STATES PATENTS

| | | | |
|---|---|---|---|
| 3,026,455 | 3/1962 | Smith | 330—69 X |
| 3,316,495 | 4/1967 | Sherer | 330—69 X |

OTHER REFERENCES

Article from IBM Technical Disclosure Bulletin, vol. 3, No. 8, Jan. 1961, p. 37, by Petrone, D. J.

ROY LAKE, *Primary Examiner.*

NATHAN KAUFMAN, *Examiner.*